US008619455B2

(12) United States Patent
Miyakawa et al.

(10) Patent No.: US 8,619,455 B2
(45) Date of Patent: Dec. 31, 2013

(54) FERROELECTRIC MEMORY

(75) Inventors: Tadashi Miyakawa, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 13/230,735

(22) Filed: Sep. 12, 2011

(65) Prior Publication Data

US 2012/0069623 A1    Mar. 22, 2012

(30) Foreign Application Priority Data

Sep. 17, 2010 (JP) .................. 2010-210077

(51) Int. Cl.
*G11C 11/22* (2006.01)

(52) U.S. Cl.
USPC ........................................ 365/145

(58) Field of Classification Search
USPC ......... 365/49.13, 65, 109, 117, 145; 257/295, 257/E21.208, E21.663, E21.664, E27.104, 257/E29.164; 438/3
See application file for complete search history.

(56) References Cited

U.S. PATENT DOCUMENTS

| | | | |
|---|---|---|---|
| 5,903,492 A | 5/1999 | Takashima | |
| 6,240,007 B1 * | 5/2001 | Kang | 365/145 |
| 6,717,839 B1 * | 4/2004 | Du | 365/145 |
| 6,885,597 B2 * | 4/2005 | Roehr et al. | 365/201 |
| 7,839,669 B2 | 11/2010 | Hoya | |
| 2004/0047171 A1 * | 3/2004 | Roehr et al. | 365/89 |
| 2010/0054064 A1 | 3/2010 | Miyakawa et al. | |

FOREIGN PATENT DOCUMENTS

| | | |
|---|---|---|
| JP | 2009-099235 | 7/2009 |
| JP | 2010-061734 | 3/2010 |

OTHER PUBLICATIONS

Zwerg et al., "An 82µA/MHz Microcontroller with Embedded FeRAM for Energy-Harvesting Applications," ISSCC2011/Session19/Low-Power Digital Techniques/19.2, 2011 IEEE International Solid-State Circuits Conference, Feb. 23, 2011, pp. 334-336.
Takashima et al., "A 76-mm2 8-Mb Chain Ferroelectric Memory", IEEE Journal of Solid-State Circuits, vol. 36, No. 11, Nov. 2001, pp. 1713-1720.
Qazi el al., "A Low-Voltage 1Mb FeRAM in 0.13µm CMOS Featuring Time-to-Digital Sensing for Expanded Operating Margin in Scaled CMOS," ISSCC 2011/Session11/Non-Volatile Memory Solutions/11.6, 2011 IEEE International solid-State Circuits conference, Feb. 22, 2011, pp. 208-210.

* cited by examiner

*Primary Examiner* — Harry W Byrne
(74) *Attorney, Agent, or Firm* — Knobbe, Martens, Olson & Bear, LLP

(57) ABSTRACT

One embodiment provides a ferroelectric memory including: memory cells each including a ferroelectric memory; first and second bitlines configured to read out cell signals from the memory cells; a first circuit configured to fix, when the cell signal is read from the memory cell to the first bitline, a voltage of the second bitline to a first power-supply voltage, and then set the second bitline to a second power-supply voltage different from the first power-supply voltage; a second circuit configured to set, after the first circuit sets the second bitline to the second power-supply voltage, the second bitline to a reference voltage; and a third circuit configured to amplify a voltage difference between the first bitline to which the cell signal is read and the second bitline to which the reference voltage is set.

18 Claims, 4 Drawing Sheets

FERROELECTRIC MEMORY

CROSS-REFERENCE TO RELATED APPLICATION(S)

This application claims priority from Japanese Patent Application No. 2010-210077 filed on Sep. 17, 2010, the entire contents of which are incorporated herein by reference.

FIELD

Embodiments described herein relate generally to a ferroelectric memory.

BACKGROUND

A ferroelectric memory (i.e., a ferroelectric random access memory (FeRAM)) is a semiconductor memory device using a hysteresis property of a ferroelectric capacitor. The FeRAM has memory cells, and each memory cell can store data in a nonvolatile manner based on two different polarization strengths of a ferroelectric material. In a readout operation, data is read from the memory cell to bitlines, a signal representing the read data is amplified by a latch type sense amplifier circuit, and the amplified signal is output to a peripheral circuit. Generally, the bitlines of a FeRAM has a so-called folded bitline structure in which two adjacently opposed bitlines are pared (see JP-2009-099235-A and JP-2010-061734-A). In the FeRAM having the folded bitlines, while data is read from a memory cell as a reading voltage to one of the bitlines, the other of the bitlines is set to a reference voltage. And, the sense amplifier circuit amplifies the difference between the reading voltage and the reference voltage. Then, the sense amplifier circuit outputs a signal corresponding to the amplified level difference.

In a ferroelectric memory, a reading voltage is determined by the capacity of the bitline and the capacity of the memory cell. However, sometimes, the voltage of one bitline is varied due to an influence of the voltage of other bitline through coupling therebetween. In the readout operation, the voltage of a bitline ranges from, for example, about 0.3 volts (V) to about 1V. On the other hand, a signal amount (level difference between the "1" readout signal and the "0" readout signal) of the memory cell ranges from about 0.3 V to about 0.5 V. Thus, the influence of an adjacent bitline causes large variation of the voltage of the bitline.

DETAILED DESCRIPTION

In general, one embodiment provides a ferroelectric memory including: a plurality of memory cells, each of the memory cells including a ferroelectric memory; first and second bitlines extended to face each other in parallel and configured to read out cell signals from the memory cells; a first circuit configured to fix, when the cell signal is read from the memory cell to the first bitline, a voltage of the second bitline to a first power-supply voltage, and then set the second bitline to a second power-supply voltage different from the first power-supply voltage; a second circuit configured to set, after the first circuit sets the second bitline to the second power-supply voltage, the second bitline to a reference voltage; and a third circuit configured to amplify a voltage difference between the first bitline to which the cell signal is read and the second bitline to which the reference voltage is set.

Embodiments will be described with reference to the accompanying-drawings.

[Embodiment 1]

Figure 1:
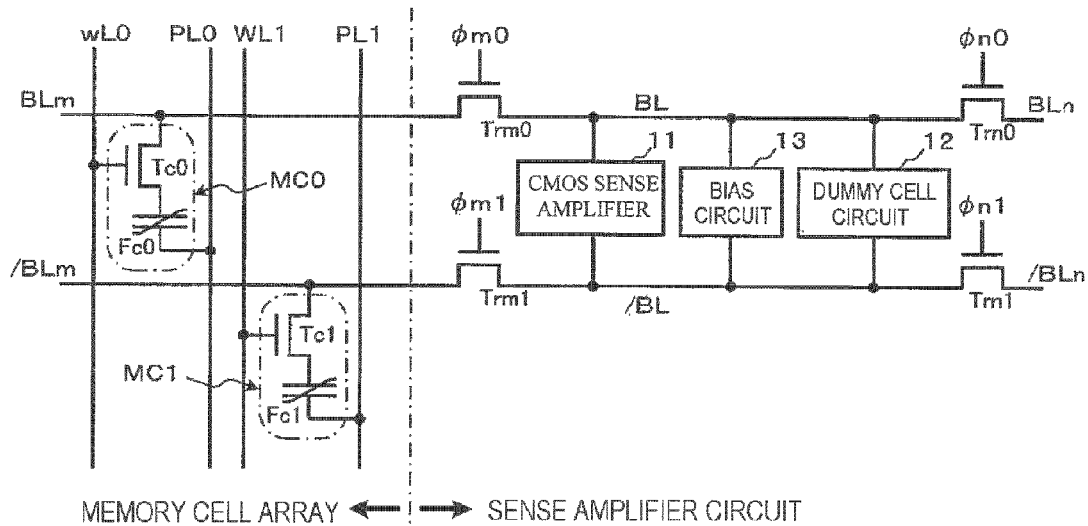
FIG. 1 illustrates a circuit configuration of a ferroelectric memory according to Embodiment 1.

FIG. 1 illustrates a circuit configuration of a ferroelectric memory according to Embodiment 1. FIG. 1 mainly illustrates a part related to a readout operation (including a reference voltage setting operation). For simplicity of drawings, FIG. 1 illustrates a single pair of bitlines BL and /BL (bitline pair) provided above a memory cell array, and memory cells MC0 and MC1 respectively connected to the bitlines BL and /BL.

The ferroelectric memory according to Embodiment 1 includes plural memory cells MC0 and MC1, ferroelectric capacitors Fc0 and Fc1, bitlines BL and /BL, transfer gates Trm0, Trn0, Trm1 and Trn1, a complementary metal-oxide semiconductor (CMOS) sense amplifier 11, a dummy cell circuit 12 and a bias circuit 13. The memory cells MC0 and MC1 are arranged like a matrix on a memory cell array. Each of the memory cells MC0 and MC1 includes a respective one of the ferroelectric capacitors Fc0 and Fc1, and is connected to a respective one of the bitlines BL and /BL. The transfer gates Trm0, Trn0, Trm1 and Trn1 are respectively provided on middle parts of the bitlines BL and /BL, in pairs.

A bitline BL includes a part BLm provided on the memory cell array, a part BL provided on a sense amplifier circuit, and a part BLn connected to an adjoining memory cell array. The part BLm is connected to the part BL at the transfer gate Trm0, while the part BL is connected to the part BLn at the transfer gate Trn0. That is, as illustrated in FIG. 1, an end of the part BLm is connected to the drain of the transfer gate Trm0. A control signal φm0 is connected to the gate of the transfer gate Trm0. An end of the part BL is connected to the source of the transfer gate Trm0. The other end of the part BL is connected to the drain of the transfer gate Trn0. A control signal φn0 is connected to the gate of the transfer gate Trn0. An end of the part BLn is connected to the source of the transfer gate Trn0 (hereinafter, the parts BL, BLm and BLn are referred to generically as the "bitline BL").

A bitline /BL includes a part /BLm provided on the memory cell array, a part /BL provided on the sense amplifier circuit, and a part /BLn connected to the adjoining memory cell array. The part /BLm is connected to the part /BL at the transfer gate Trm1, while the part /BL is connected to the part /BLn at the transfer gate Trn1. That is, as illustrated in FIG. 1, an end of the part /BLm is connected to the drain of the transfer gate Trm1. A control signal φm1 is connected to the gate of the transfer gate Trm1. An end of the part /BL is connected to the source of the transfer gate Trm1. The other end of the part /BL is connected to the drain of the transfer gate Trn1. A control signal φn1 is connected to the gate of the transfer gate Trn1. An end of the part /BLn is connected to the source of the transfer gate Trn1 (hereinafter, the parts /BL, /BLm and /BLn are referred to generically as the "bitline /BL").

The memory cell MC0 is connected between the part BLm and a plate line PL0. A wordline WL0 is connected to the control terminal of the memory cell MC0. The memory cell MC1 is connected between the part /BLm and a plate line PL1. A wordline WL1 is connected to the control terminal of the memory cell MC1.

Each of the CMOS sense amplifier 11, the dummy cell circuit 12 and the bias circuit 13 is connected between the part BL and the part /BL.

The memory cell MC0 includes a cell transistor Tc0 and a cell capacitor Fc0 connected in series. The cell transistor Tc0 is an n-type metal-oxide semiconductor (n-type MOS or NMOS) transistor. The cell capacitor Fc0 is a ferroelectric capacitor. The drain of the cell transistor Tc0 is connected to the part BLm of the bitline. The wordline WL0 is connected to the gate of the cell transistor Tc0. The source of the cell transistor Tc0 is connected to one terminal of the cell capacitor Fc0. The other terminal of the cell capacitor Fc0 is connected to the plate line PL0.

The memory cell MC1 includes a cell transistor Tc1 and a cell capacitor Fc1 connected in series. The cell transistor Tc1 is an NMOS transistor. The cell capacitor Fc1 is a ferroelectric capacitor. The drain of the cell transistor Tc1 is connected to the part /BLm of the bitline. The wordline WL1 is connected to the gate of the cell transistor Tc1. The source of the cell transistor Tc1 is connected to one terminal of the cell capacitor Fc1. The other terminal of the cell capacitor Fc1 is connected to the plate line PL1.

The bitlines BL and /BL extend so as to be in parallel above the memory cell array and the sense amplifier circuit to face each other. The bitlines BL and /BL configure a bitline pair having a so-called folded bitline structure. In the folded bitline structure, in the readout operation, cell data (represented by a cell signal) is read out to one bitline of the bitline pair while a reference voltage is set to the other bitline of the bitline pair. Plural bitline pairs (BL, /BL) are iteratively provided on the memory cell array to adjoin one another.

The CMOS sense amplifier 11 has a general cross-coupled CMOS type configuration (see, e.g., JP-2009-099235-A).

The dummy cell circuit 12 is configured to set a reference voltage to a reference bitline which is used to discriminate "0" data and "1" data read out of the memory cell. The reference voltage is provided through the capacitance-division of the bitline capacitance and the dummy cell capacitance, before the CMOS sense amplifier 11 amplifies the voltage difference in the bitline pair. For example, when data is read from the memory cell MC0 to the bitline BL, the dummy cell circuit 12 sets the reference voltage to the bitline /BL. On the other hand, when data is read from the memory cell MC1 to the bitline /BL, the dummy cell circuit 12 sets the reference voltage to the bitline BL. The bitline to which data is read will be referred to as a "readout-side bitline", and the bitline to which the reference voltage is set will be referred to as a "reference-side bitline".

The bias circuit 13 is configured to fix a voltage of the reference-side bitline to "H"-level when a cell signal is read out from the memory cell to the readout-side bitline, and then, once reset the reference-side bitline to ground voltage (GND) before a reference voltage is set to the reference-side bitline by the dummy cell circuit 12. The configurations and operations of the dummy cell circuit 12 and the bias circuit 13 are described below in detail with reference to FIGS. 3 and 4.

Figure 2:
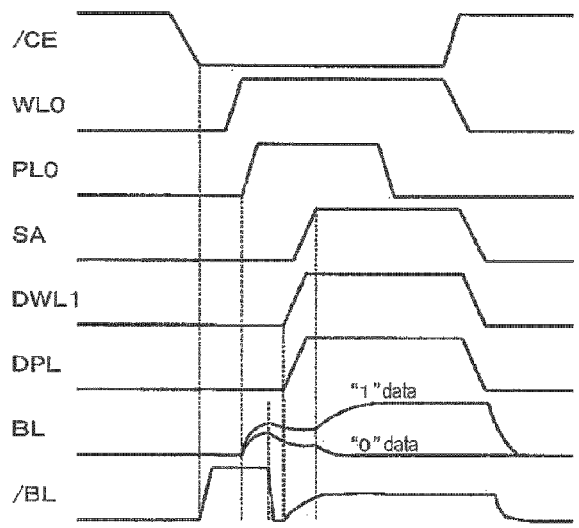
FIG. 2 is a waveform chart illustrating a readout operation of the ferroelectric memory according to Embodiment 1.

FIG. 2 is a waveform chart illustrating a readout operation of the ferroelectric memory according to Embodiment 1. FIG. 2 illustrates the waveform of related signals in the case that data is read from the memory cell MC0 to the bitline BL.

A signal /CE is provided for selecting a device, and the device is activated when the signal /CE is "L"-level. A signal SA is provided for driving the CMOS sense amplifier 11. At a rising edge of the signal SA, the CMOS sense amplifier 11 is activated and starts to amplify the voltage difference in the bitline pair. Signals DWL1 and DPL are provided for driving the dummy cell circuit 12. The bitline /BL is selected according to the signal DWL1, and the reference voltage is generated at a rising edge of the signal DPL.

First, in a standby state in which the signal /CE is "H"-level, the bitlines BL and /BL are precharged to the low voltage (i.e., the ground voltage GND). At a falling edge of the signal /CE, the precharge state of the readout-side bitline BL ends. Then, the readout-side bitline BL is brought into a floating state. On the other hand, the reference-side bitline /BL is set and fixed by the bias circuit 13 to a high voltage (Va). Next, the readout cell MC0 is selected due to the "H"-level of the wordline WL0. At a rising edge of the signal PL0, the readout of cell data (cell signal) from the memory cell MC0 to the readout-side bitline BL is started. At that time, the bias circuit 13 fixes the voltage of the reference-side bitline /BL at the high voltage (Va).

Generally, the voltage of the readout-side bitline BL is affected by the voltage of the reference-side bitline /BL due to a capacitive coupling therebetween. Thus, the voltage variation during the readout of the cell signal to the readout-side bitline BL can be constrained by fixing the voltage of the reference-side bitline /BL at Va.

Next, before a sense operation of the bitline pair, the bias circuit 13 once resets the reference-side bitline /BL to the low voltage (GND).

In the FeRAM, the cell data (cell signal) is read out by applying a voltage difference onto the ferroelectric capacitor to thereby cause a polarization reversal. If the voltage difference applied to the memory cell MC0 is too small, the sufficient polarization reversal may not occur in the ferroelectric capacitor FC0. Thus, it is preferable to increase a voltage difference between the plate line PL0 and the readout-side bitline BL, in order to read out the cell signal having the sufficient magnitude. However, when the cell signal is read out to the readout-side bitline BL, the voltage of the readout-side bitline BL itself is increased, and the voltage difference applied onto the memory cell MC0 is decreased. As a result, the cell signal read out from the memory cell MC0 becomes small.

For example, a high readout voltage may be associated with "1" data, and a low readout voltage may be associated with "0" data. In this case, the "1" cell signal is more largely decreased as compared with the "0" cell signal by the above-mentioned effect. Thus, difference between the "1" cell signal and the "0" cell signal may be decreased, and the discrimination between "1" data and "0" data becomes difficult.

By resetting the reference-side bitline /BL to the low voltage (GND) before the sense operation, the voltage of the readout-side bitline BL can be decreased through the inter-bitline capacitive coupling. As a result, the voltage difference between the plate line PL0 and the reference-side bitline /BL can be made large so that the cell signal having the sufficient magnitude can be read out. This operation is called as an "overdrive".

Therefore, by resetting the reference-side bitline /BL to the low voltage (GND) before the sense operation, a signal amount defined as the level difference between the "1" readout signal and the "0" readout signal can be increased. That is, the readout operation margin can be enhanced.

Then, the bias circuit 13 brings the reference-side bitline /BL into a floating state. Similarly to an ordinary sense operation, the dummy cell circuit 12 sets the reference-side bitline /BL to the reference voltage according to the signals DWL1 and DPL. In addition, the CMOS sense amplifier 11 amplifies the voltage difference in the bitline pair according to the signal SA. Thus, the readout of the data is completed.

Figure 3:
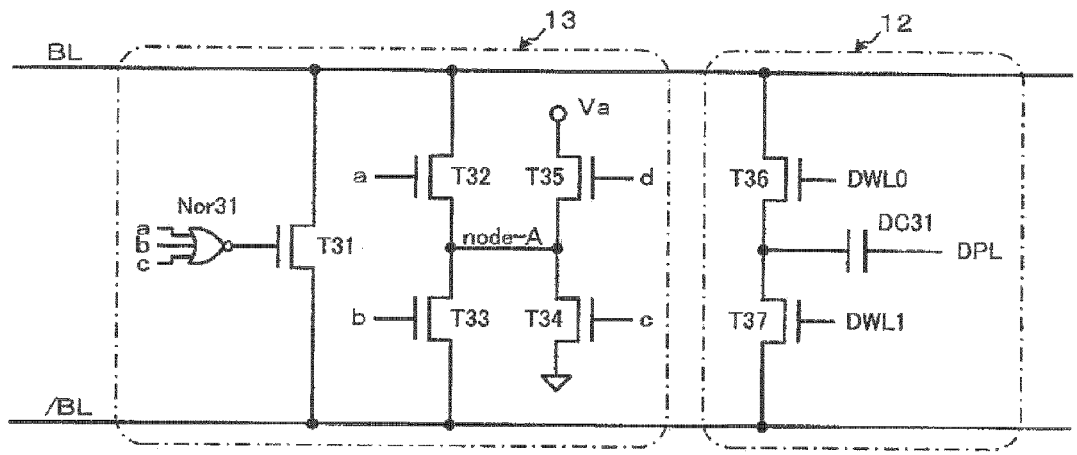
FIG. 3 illustrates circuit configurations of a bias circuit and a dummy cell circuit of the ferroelectric memory according to Embodiment 1.

FIG. 3 illustrates circuit configurations of the bias circuit 13 and the dummy cell circuit 12 in the ferroelectric memory according to Embodiment 1.

The bias circuit 13 functions as both of a precharge circuit and an overdrive circuit. The bias circuit 13 includes a three-input NOR gate 31 and five NMOS transistors T31 to T35. The dummy cell circuit 12 includes a dummy capacitor DC31 and two NMOS transistors T36 and T37.

A control signal a is input to a first input terminal of the NOR gate 31. A control signal b is input to a second input terminal of the NOR gate 31. A control signal c is input to a third terminal of the NOR gate 31. An output of the NOR gate 31 is connected to the gate of the transistor T31. The drain of the transistor T31 is connected to the bitline BL, while the source of the transistor T31 is connected to the bitline /BL.

The drain of the transistor T32 is connected to the bitline BL. A control signal a is input to the gate of the transistor T32. The source of the transistor T32 is connected to a node-A. The source of the transistor T33 is connected to the bitline BL. A control signal b is input to the gate of the transistor T33. The drain of the transistor T33 is connected to the mode-A. The source of the transistor T34 is connected to the ground voltage GND. A control signal c is input to the gate of the transistor T34. The drain of the transistor T34 is connected to the node-A. The drain of the transistor T35 is connected to the power-supply voltage Va. A control signal d is input to the gate of the transistor T35. The source of the transistor T35 is connected to the node-A.

The drain of the transistor T36 is connected to the bitline BL. A control signal DWL0 is input to the gate of the transistor T36. The drain of the transistor T37 is connected to the source of the transistor T36. A control signal DWL1 is input to the gate of the transistor T37. The source of the T37 is connected to the bitline /BL. One terminal of a capacitor DC31 is connected to the source of transistor T36. A control signal DPL is connected to the other end of the capacitor DC31. A control signal DPL is connected to the other terminal of the transistor DC31.

Figure 4:
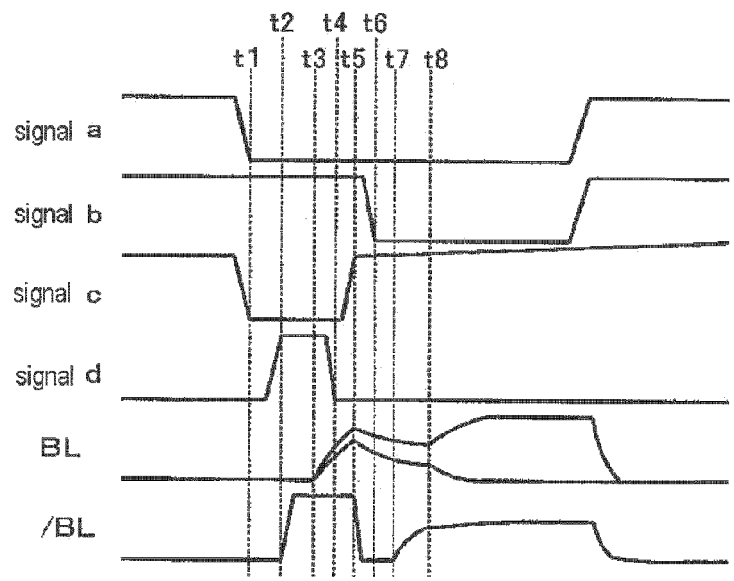
FIG. 4 is a waveform chart illustrating an operation of the bias circuit of the ferroelectric memory according to Embodiment 1.

FIG. 4 is a waveform chart illustrating an operation (readout operation) of the bias circuit 13 of the ferroelectric memory according to Embodiment 1. For example, it is assumed that the memory cell MC0 connected to the bitline BL is a selected memory cell, the reference voltage is set to the bitline /BL, and the CMOS sense amplifier 11 amplifies the voltage difference in the bitline pair.

First, a readout operation is started at moment t1 in a standby state. Precharging the bitlines BL and /BL to the low voltage (GND) is completed by setting each of the control signals a and c from "H"-level to "L"-level. The bitline BL to which a cell signal is read from the selected memory cell MC0 is put into a floating state. At moment t2, the bias voltage Va is set as the voltage of the bitline /BL by changing the control signal d from "L"-level to "H"-level. At that time, the control signal b is maintained at "H"-level. At moment t3, cell data (represented by a cell signal) stored in the memory cell MC0 is read to the bitline BL by activating the selected wordline WL0 and the plate line PL0. At moment t4, the control signal d is changed from "H"-level to "L"-level. At moment t5, the control signal c is changed from "L"-level to "H"-level. Thus, the voltage of the bitline /BL is reset from the bias voltage Va to the ground voltage (GND). Consequently, the "overdrive" is performed on the bitline BL utilizing the interbitline capacitive coupling. Then, at moment t6, the control signal b is changed from "H"-level to "L"-level. Thus, the bitline /BL is put into a floating state. At moment t7, the dummy cell is selected by activating the corresponding signals DWL1 and DPL. Thus, the bitline /BL is set to the reference voltage. At moment t8, the CMOS sense amplifier 11 is caused to operate. Consequently, the CMOS sense amplifier 11 amplifies the voltage difference between the bitlines BL and /BL of the bitline pair. Thus, the data readout operation is completed.

[Embodiment 2]

Figure 5A:
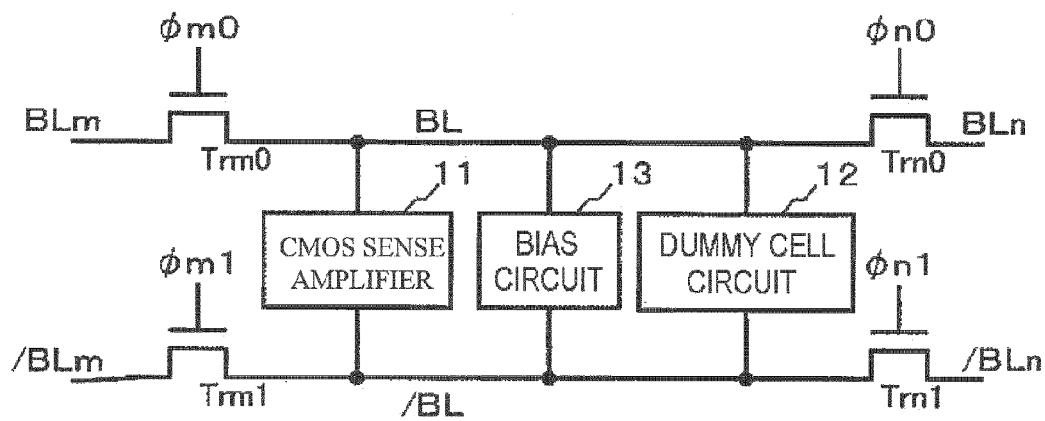
FIGS. 5A and 5B illustrate a circuit configuration of a ferroelectric memory according to Embodiment 2.
Figure 5B:
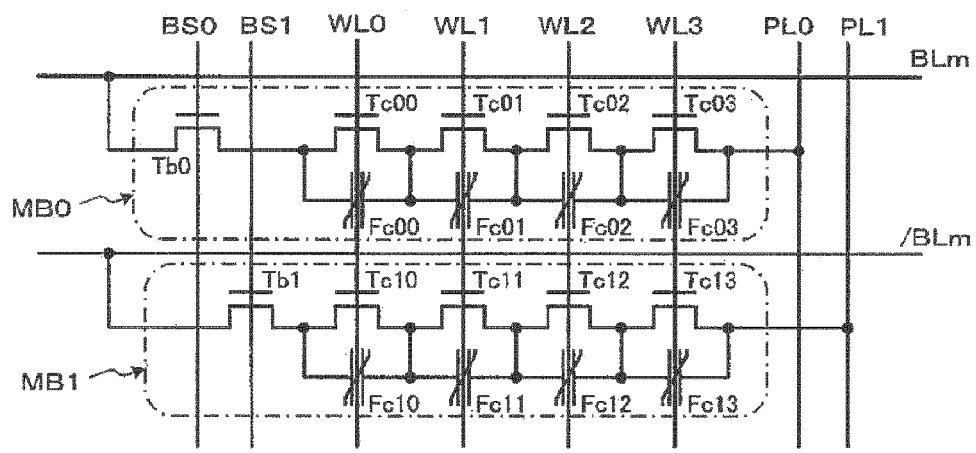

FIGS. 5A and 5B illustrate a circuit configuration of a ferroelectric memory according to Embodiment 2. FIGS. 5A and 5B mainly illustrate a part related to a readout operation (including a reference voltage setting operation). For simplicity of drawing, FIGS. 5A and 5B illustrate only a single pair of the bitlines BL and /BL (bitline pair) provided above a memory cell array, and memory cell blocks MB0 and MB1 respectively connected one-on-one to the bitlines BL and /BL.

The ferroelectric memory according to Embodiment 2 includes plural memory cell blocks MB0 and MB1, ferroelectric capacitors Fc00 to Fc13, bitlines BL and /BL, transfer gates Trm0, Trn0, Trm1 and Trn1, a CMOS sense amplifier 11, a dummy cell circuit 12 and a bias circuit 13. The memory cell blocks MB0 and MB1 are arranged like a matrix on a memory cell array. Each of the memory cell blocks has the respective plural ferroelectric capacitors, and is connected to respective one of the bitlines BL and /BL. The transfer gates Trm0, Trn0, Trm1 and Trn1 are respectively provided on middle parts of the bitlines BL and /BL, in pairs.

As shown in FIG. 5A, the configurations of the bitlines BL and /BL, the CMOS sense amplifier 11, the dummy cell circuit 12 and the bias circuit 13 are similar to those in Embodiment 1. Therefore, the detailed description of such components is omitted, and the same reference numerals as those in Embodiment 1 are given. Embodiment 2 differs from Embodiment 1 in a configuration that each of the memory cell blocks MB0 and MB1 is provided as the so-called series-connected transistor-capacitor (TC) parallel unit type (see, e.g., JP-2009-099235-A), and in a readout operation.

As shown in FIG. 5B, the The memory cell block MB0 is connected between the part BLm and a plate line PL0. Wordlines WL0 to WL3 are connected to the control terminal of the memory cell block MB0. The memory cell block MB1 is connected between the part /BLm and a plate line PL1. The wordlines WL0 to WL3 are connected to the control terminal of the memory cell block MB1.

In the memory cell block MB0, four cell units each having a cell transistor (Tc00, . . . , or Tc03) and a cell capacitor (Fc00, . . . , or Fc03) connected in parallel are series-connected. And, one terminal of the memory cell block MB0 is connected to the bitline BL via a block selection transistor Tb0, while the other terminal of the memory cell block MB0 is connected to the plate line PL0. The different wordlines WL0 to WL3 are connected to the gates of each cell transistor. The block selection transistor Tb0 and the cell transistors Tc00 to Tc03 are NMOS transistors. The cell capacitors Fc00 to Fc03 are ferroelectric capacitors.

The drain of the block selection transistor Tb0 is connected to the part BLm. A block selection signal BS0 is connected to the gate of the block selection transistor Tb0. The source of the block selection transistor Tb0 is connected to the drain of the cell transistor Tc00. The wordline WL0 is connected to the gate of the cell transistor Tc00. One terminal of a cell capacitor Fc00 is connected to the drain of the cell transistor Tc00. The other terminal of the cell capacitor Fc00 is connected to the source of the cell transistor Tc00. The drain of a cell transistor Tc01 is connected to the source of the cell transistor Tc00. The wordline WL1 is connected to the gate of a cell transistor Tc01. One terminal of a cell capacitor Fc01 is connected to the drain of the cell transistor Tc01. The other terminal of the cell capacitor Fc01 is connected to the source of the cell transistor Tc01. The drain of a cell transistor Tc02 is connected to the source of that Tc01. The wordline WL2 is connected to the gate of the cell transistor Tc02. One terminal of a cell capacitor Fc02 is connected to the drain of the cell transistor Tc02. The other terminal of the cell capacitor Fc02 is connected to the source of the cell transistor Tc02. The drain of a cell transistor Tc03 is connected to the source of that Tc02. The wordline WL3 is connected to the gate of the cell transistor Tc03. The source of the cell transistor Tc03 is connected to the plate line PL0. One terminal of a cell capacitor Fc03 is connected to the drain of the cell transistor Tc03. The other terminal of the cell capacitor Fc03 is connected to the source of the cell transistor Tc03.

In the memory cell block MB1, four cell units each having a cell transistor (Tc10, ..., or Tc13) and a cell capacitor (Fc10, ..., or Fc03) connected in parallel are series-connected. And, one terminal of the memory cell block MB1 is connected to the bitline /BL via a block selection transistor Tb1, while the other terminal of the memory cell block MB1 is connected to the plate line PL1. The different wordlines WL0 to WL3 are connected to the gates of each cell transistor. The block selection transistor Tb1 and the cell transistors Tc10 to Tc13 are NMOS transistors. The cell capacitors Fc10 to Fc13 are ferroelectric capacitors.

The drain of the block selection transistor Tb1 is connected to the part /BLm. A block selection signal BS1 is connected to the gate of the block selection transistor Tb1. The source of the block selection transistor Tb1 is connected to the drain of the cell transistor Tc10. The wordline WL0 is connected to the gate of the cell transistor Tc10. One terminal of a cell capacitor Fc10 is connected to the drain of the cell transistor Tc10. The other terminal of the cell capacitor Fc10 is connected to the source of the cell transistor Tc10. The drain of a cell transistor Tc11 is connected to the source of the cell transistor Tc10. The wordline WL1 is connected to the gate of a cell transistor Tc11. One terminal of a cell capacitor Fc11 is connected to the drain of the cell transistor Tc11. The other terminal of the cell capacitor Fc11 is connected to the source of the cell transistor Tc11. The drain of a cell transistor Tc12 is connected to the source of that Tc11. The wordline WL2 is connected to the gate of the cell transistor Tc12. One terminal of a cell capacitor Fc12 is connected to the drain of the cell transistor Tc12. The other terminal of the cell capacitor Fc12 is connected to the source of the cell transistor Tc12. The drain of a cell transistor Tc13 is connected to the source of that Tc12. The wordline WL3 is connected to the gate of the cell transistor Tc13. The source of the cell transistor Tc13 is connected to the plate line PL1. One terminal of a cell capacitor Fc13 is connected to the drain of the cell transistor Tc13. The other terminal of the cell capacitor Fc13 is connected to the source of the cell transistor Tc13.

Figure 6:
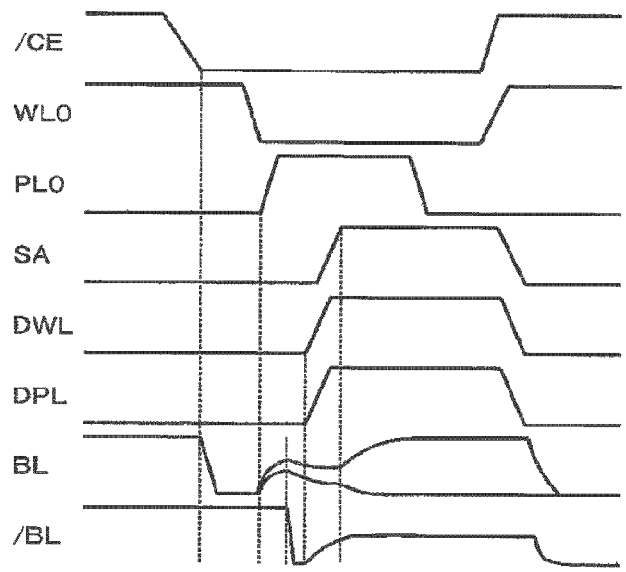
FIG. 6 is a waveform chart illustrating a readout operation of the ferroelectric memory according to Embodiment 2.

FIG. 6 is a waveform chart illustrating a readout operation of the ferroelectric memory according to Embodiment 2. FIG. 6 illustrates the waveform of related signals in the case that data is read from the memory cell block MB0 to the bitline BL.

Signals /CE, SA, DWL1, and DPL are control signals having functions similar to those of the associated signals according to Embodiment 1. Therefore, the detailed description of such signals is omitted. Embodiment 2 differs from Embodiment 1 in that the bitline pair (of the bitlines BL and /BL) in a standby state is precharged to high voltage (Va), and that because each of the memory cell blocks MB0 and MB1 is of the series-connected TC parallel unit type, the cell capacitor from which data is read is selected at the "L"-level of the wordline.

First, in the standby state in which the signal /CE is "H"-level, the bitlines BL and /BL are precharged to the high voltage (Va). At a falling edge of the signal /CE, the precharge state of the readout-side bitline BL ends, and the readout-side bitline BL is set to the low voltage (GND). Then, the readout-side bitline BL is brought into a floating state. However, the reference-side bitline /BL is set and fixed by the bias circuit 13 to a high voltage (Va). Next, the readout cell (Fc00) is selected due to the "L"-level of the wordline WL0. At a rising edge of each of the signals BS0 and PL0, the readout cell data (cell signal) from the memory cell MB0 to the bitline BL is started. At that time, the bias circuit 13 causes the reference-side bitline /BL to remain at the high voltage (Va). Accordingly, occurrence of the variation in voltage, which is associated with the readout of the cell signal to the bitline BL, can be constrained.

Next, before a sense operation of the bitline pair, the bias circuit 13 once resets the reference-side bitline /BL to the low voltage (GND). A signal amount defined as the difference between the signal level at the readout of "1" data from the selected cell Fc00 and that at the readout of "0" data therefrom can be increased by setting the bitline /BL to the low voltage.

Then, the bias circuit 13 brings the reference-side bitline /BL into a floating state. Similarly to the ordinary sense operation, the dummy cell circuit 12 sets the reference-side bitline /BL to the reference voltage according to the signals DWL1 and DPL. In addition, the CMOS sense amplifier 11 amplifies the voltage difference in the bitline pair according to the signal SA. Thus, the readout of the data is completed.

According to Embodiment 1 and Embodiment 2, when a cell signal is read out from the memory cell to the readout-side bitline BL, the reference-side bitline /BL is fixed to the power-supply voltage Va. Accordingly, the influence of variation in a cell-signal amount, which is given to the bitline, can be reduced, and the readout operation margin can considerably be enhanced.

According to Embodiment 1 and Embodiment 2, since the bitline pairs (BL, /BL) are iteratively provided to extend on the memory cell array to adjoin one another, the readout-side bitline BL of each bitline pair is interposed between the reference-side bitline BL thereof and that of each adjoining bitline pair. Thus, the readout operation margin can be further enhanced.

According to Embodiment 1 and Embodiment 2, after a cell signal is read to the readout-side bitline BL, the reference-side bitline /BL is changed from "H"-level to "L"-level to thereby perform the "overdrive" on the bitline BL. Thus, the signal amount which is the difference between the signal level representing "1" data read out to the bitline BL and the signal level representing "0" data read out thereto is increased. Then, the CMOS sense amplifier 11 amplifies the signal level difference therebetween. Consequently, the readout operation margin can further be enhanced.

According to Embodiment 1 and Embodiment 2, the "overdrive" is performed on the readout-side bitline BL utilizing the interbitline capacitive coupling by controlling the reference-side bitline /BL. Thus, for example, a large capacitor dedicated for the "overdrive" is not necessary, and the chip area of the memory can be saved.

In Embodiment 1 and Embodiment 2, it is illustrated that the bitline pair extend on the memory cell array to face each other. The configuration of the bitline pair is not limited thereto. For example, a so-called twisted configuration, in which the bitline pair exchange positions thereof at a middle part thereof can be employed. In the twisted configuration, the influence of each bitline adjacent to a bitline connected to a readout cell can be alleviated. Thus, by employing the twisted configuration in addition to the configurations of the embodiments, readout operation margin can be further enhanced.

In Embodiment 1 and Embodiment 2, the conventional 1-transistor 1-capacitor (1T1C) type configuration or the series-connected TC parallel unit chain type configuration is illustrated as the configuration of the memory cell array. However, the configuration of the memory cell array is not limited thereto. The invention can be widely applied to memory cell arrays employing the folded bitline structure, regardless of the configuration of the cells.

In Embodiment 2, each of the memory cell blocks MB0 and MB1 includes series-connected four cell units. However, the configuration of each memory cell block is not limited thereto. In principle, each memory cell block may be configured by an optional number of cell units.

Embodiment 3

Figure 7:
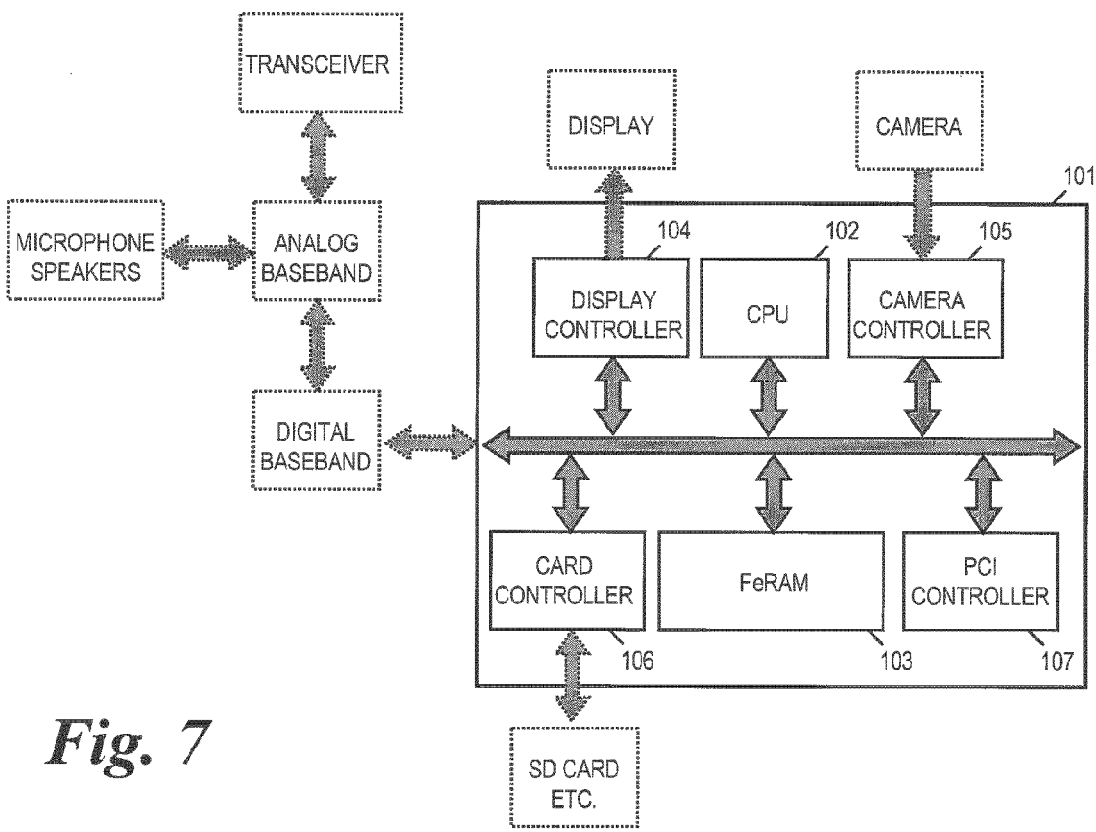
FIG. 7 illustrates a semiconductor chip according to Embodiment 3.

FIG. 7 illustrates a semiconductor chip according to Embodiment 3. A semiconductor chip 101 according to Embodiment 3 includes a CPU 102 and an FeRAM 103. The semiconductor chip 101 further includes, as various controllers, for example, a display controller 104, a camera controller 105, a card controller 106 and a PCI controller 107. That is, the semiconductor chip 101 has a so-called system on chip (SOC) structure.

The FeRAM according to Embodiment 1 or Embodiment 2 can be applied as the FeRAM 103 in the semiconductor chip 101. As described above, according to Embodiment 1 and Embodiment 2, the readout operation margin of the FeRAM can be enhanced even when the power supply voltage is lowered, without increasing the chip area. Thus, the FeRAM according to Embodiment 1 or Embodiment 2 can be suitably used in a portable device, such as a cell phone. Specifically, as exemplified in Embodiment 3, the FeRAM will be suitably used as an embedded memory in the portable device.

The FeRAM according to Embodiment 1 or Embodiment 2 can also be used in a device other than the portable device. The FeRAM may be provided as a discrete chip, or as a part of the SOC, as exemplified in Embodiment 3.

The above embodiments are presented only as examples, and are not intended to limit the scope of the invention. The novel circuits, systems and methods described herein can be embodied in other various forms, and subjected to various omissions, substitutions and changes in the forms of circuits, systems and methods without departing from the spirit of the invention. Claims or equivalents thereof include embodiments and modifications thereof within the scope and spirit of the invention.

The invention claimed is:

1. A ferroelectric memory comprising:
a plurality of memory cells, each of the memory cells including a ferroelectric memory;
first and second bitlines facing each other in parallel and configured to read cell signals from the memory cells;
a first circuit configured to
fix, when the cell signal is read from the memory cell to the first bitline, a voltage of the second bitline to a first power-supply voltage, and
then set the second bitline to a second power-supply voltage different from the first power-supply voltage;
a second circuit configured to set, after the first circuit sets the second bitline to the second power-supply voltage, the second bitline to a reference voltage; and
a third circuit configured to amplify a voltage difference between the first bitline to which the cell signal is read and the second bitline to which the reference voltage is set.

2. The ferroelectric memory of claim 1,
wherein the first circuit comprises
a first MOS transistor comprising a first drain connected to the first bitline, and a first gate connected to a first control signal;
a second MOS transistor comprising a source connected to the second bitline, and a second gate connected to a second control signal, and a second drain connected to a first source of the first MOS transistor;
a third MOS transistor comprising a third drain connected to the first power-supply voltage, a third gate connected to a third control signal, and a third source connected to the first source of the first MOS transistor; and
a fourth MOS transistor comprising a fourth source connected to the second power-supply voltage, a fourth gate connected to a fourth control signal, and a fourth drain connected to the first source of the first MOS transistor.

3. The ferroelectric memory of claim 1,
wherein each of the memory cells includes the ferroelectric capacitor and a cell transistor which are connected in parallel, and
wherein the memory cells are series-connected such that one terminal of which is connected to the first bitline or the second bitline via a block selection transistor.

4. The ferroelectric memory of claim 1,
wherein each of the memory cells includes the ferroelectric capacitor and a cell transistor which are connected in series, and
wherein one terminal of each of the memory cells at a side of the cell transistor is connected to the first bitline or the second bitline.

5. The ferroelectric memory of claim 1,
wherein the first and second bitlines are charged to the second power-supply voltage in a standby state, and
wherein the second bitline is set to the first power-supply voltage before the cell signal is read to the first bitline.

6. The ferroelectric memory of claim 1,
wherein the first and second bitlines are charged to the first power-supply voltage in a standby state, and
wherein the first bitline is set to the second power-supply voltage before the cell signal is read.

7. The ferroelectric memory of claim 1,
wherein the first power-supply voltage is a system power supply voltage, and
wherein the second power-supply voltage is a ground voltage.

8. The ferroelectric memory of claim 1,
wherein the first circuit is configured to set the second bitline to the second power-supply voltage before the second circuit sets the second bitline to the reference voltage to thereby increase a voltage difference applied on the ferroelectric capacitor during a read of the cell signal to the first bitline.

9. The ferroelectric memory of claim 1,
wherein the first circuit is configured to perform an overdrive on the ferroelectric capacitor.

10. A method for controlling a ferroelectric memory, the ferroelectric memory comprising a plurality of memory cells each including a ferroelectric memory and first and second bitlines configured to read cell signals from the memory cells, the method comprising:
- fixing, when the cell signal is read from the memory cell to the first bitline, a voltage of the second bitline to a first power-supply voltage; and
- setting the second bitline to a second power-supply voltage different from the first power-supply voltage;
- reading the cell signal from the memory cell to the first bitline;
- setting the second bitline to a reference voltage; and
- amplifying a voltage difference between the first bitline to which the cell signal is read and the second bitline to which the reference voltage is set.

11. The method of claim 10,
wherein the first and second bitlines are charged to the second power-supply voltage in a standby state, and
wherein the second bitline is set to the first power-supply voltage before the cell signal is read out to the first bitline.

12. The method of claim 10,
wherein the first and second bitlines are charged to the first power-supply voltage in a standby state, and
wherein the first bitline is set to the second power-supply voltage before the cell signal is read out.

13. The method of claim 10,
wherein the first power-supply voltage is a system power supply voltage, and
wherein the second power-supply voltage is a ground voltage.

14. The method of claim 10,
wherein the second bitline is set to the second power-supply voltage in connection with a read of the cell signal from the memory cell to the first bitline to thereby increase a voltage difference applied on the ferroelectric capacitor during the read of the cell signal to the first bitline.

15. The method of claim 10,
wherein the second bitline is set to the second power-supply voltage in connection with a read of the cell signal from the memory cell to the first bitline to thereby perform an overdrive on the ferroelectric capacitor.

16. A semiconductor chip comprising the ferroelectric memory of claim 1.

17. The semiconductor chip of claim 16, further comprising a CPU.

18. The semiconductor chip of claim 16, wherein the semiconductor chip has a system-on-chip structure.

* * * * *